United States Patent [19]

Katakura et al.

[11] Patent Number: 5,185,569
[45] Date of Patent: Feb. 9, 1993

[54] PEAK VALUE DETECTING CIRCUIT

[75] Inventors: Masayuki Katakura; Masaaki Ishihara, both of Kanagawa, Japan

[73] Assignee: Sony Corporation, Tokyo, Japan

[21] Appl. No.: 744,242

[22] Filed: Aug. 13, 1991

[30] Foreign Application Priority Data

Aug. 14, 1990 [JP] Japan .................................. 2-214592

[51] Int. Cl.$^5$ ......................... G01R 19/04; H04H 5/00
[52] U.S. Cl. .................................... 324/103 P; 381/10
[58] Field of Search ............. 324/103 P, 102; 381/10, 381/11, 13, 98; 307/351

[56] References Cited

U.S. PATENT DOCUMENTS 4,703,501  10/1987  Sugai et al. ............................. 381/13
4,769,840  9/1988  Saisho ..................................... 381/98

Primary Examiner—Ernest F. Karlsen
Attorney, Agent, or Firm—Lewis H. Eslinger; Jay H. Maioli

[57] ABSTRACT

A peak value detecting circuit has a peak voltage holding circuit, a voltage comparing section, a holding voltage control circuit, and a signal output circuit. The peak voltage holding circuit holds a peak value of an input signal voltage. The voltage comparing section compares the peak voltage held by the peak voltage holding circuit with an externally input signal voltage. The holding voltage control circuit controls the level of the peak voltage in accordance with the output given by the voltage comparing section as a result of the compare operation in the latter. The signal output circuit acts as a buffer in sending to the outside the peak voltage held by the peak voltage holding circuit. The output voltage from the signal output circuit is fed back as a reference voltage to a compare input terminal of the voltage comparing section and prevents any offset that may develop in the signal output circuit from appearing in the output signal voltage of the peak value detecting circuit.

6 Claims, 3 Drawing Sheets

FIG. I
PRIOR ART
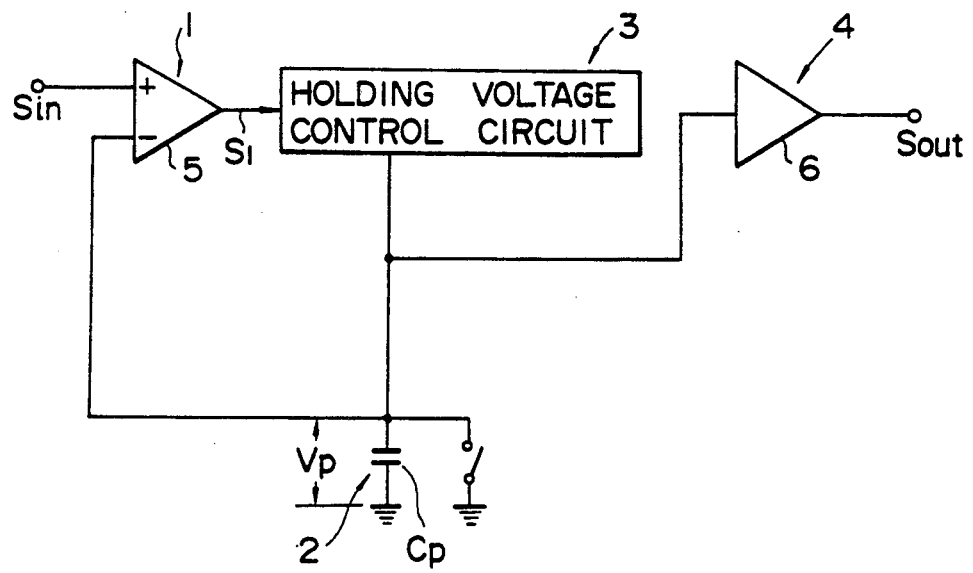
FIG. 2A
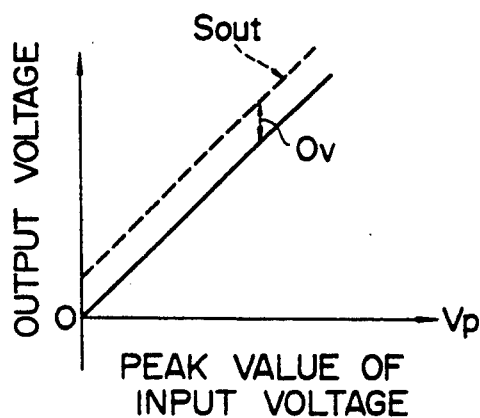
FIG. 2B
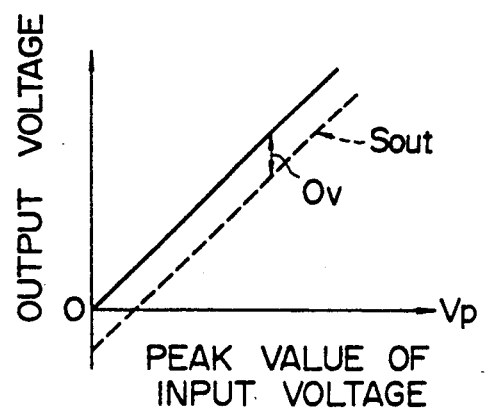

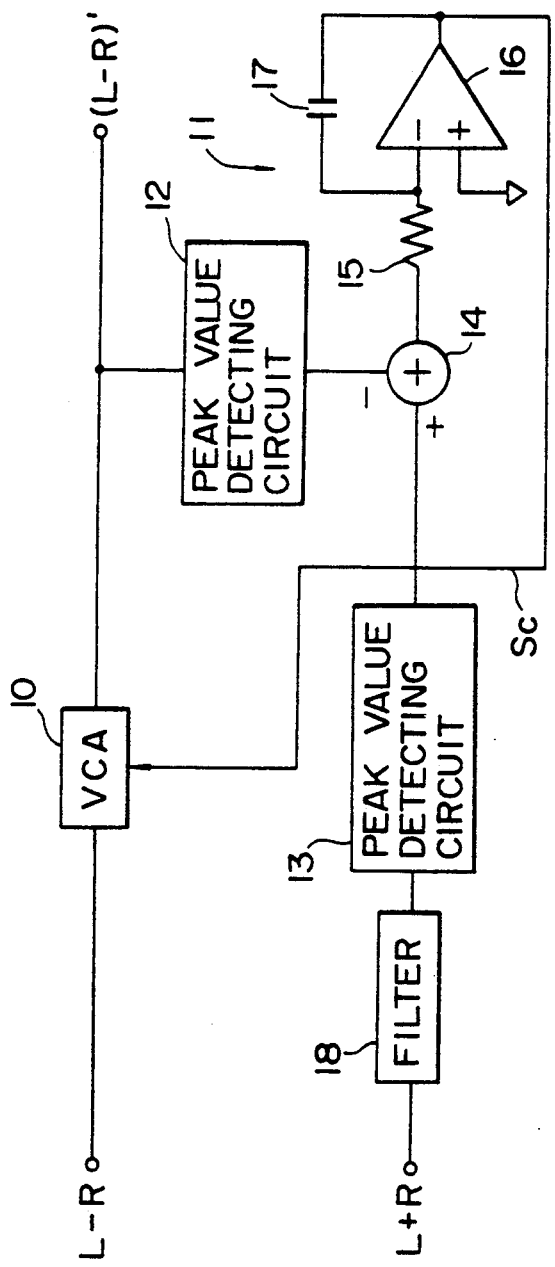
F I G. 6
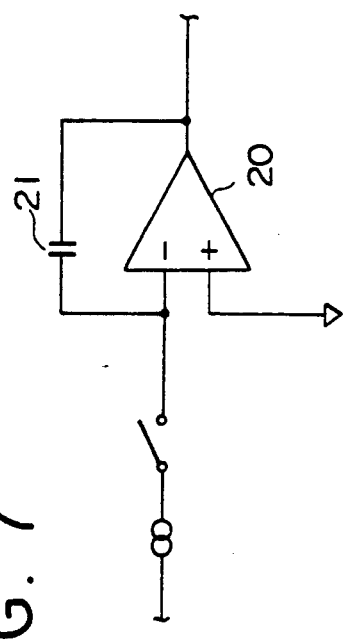
F I G. 7

PEAK VALUE DETECTING CIRCUIT

BACKGROUND OF THE INVENTION

1. Field of the Invention

The present invention relates to a peak value detecting circuit and, more particularly, to a peak value detecting circuit which handles signals of low levels.

2. Description of the Prior Art

Peak value detecting circuits are known to be used in various electronic devices. The peak value detecting circuit is a circuit that keeps monitoring the magnitude of an input signal voltage and maintains under a certain level the highest voltage of that input signal. FIG. 1 is a block diagram of a typical prior art peak value detecting circuit. As shown in FIG. 1, the peak value detecting circuit comprises a voltage comparing section 1, a peak voltage holding circuit 2, a holding voltage control circuit 3 and a signal output circuit 4.

In this prior art peak value detecting circuit, an externally input signal is applied to a compare input terminal of a comparator which constitutes the voltage comparing section 1. At the same time, the voltage held by the peak voltage holding circuit 2 is supplied to a reference input terminal of the comparator 5. The two input signals are compared in terms of level. If the externally input signal is greater than the reference voltage, the former signal is held as a new peak value by a peak holding capacitor Cp in the peak voltage holding circuit 2. In this manner, the peak voltage holding circuit holds the signal of the highest level that has been input so far.

The signal output circuit 4 forwards to the outside the peak voltage held by the peak voltage holding circuit 2. Acting as it does, the circuit 4 serves as a buffer arrangement with external circuits. The signal output circuit 4 may be implemented using a buffer amplifier 6 that performs impedance conversion. One disadvantage of the buffer amplifier 6 is that it can develop a DC offset. The DC offset can cause some undesirable effects. For example, when a peak value Vp held by the peak voltage holding circuit 2 is output to the outside via the buffer amplifier 6, a positive offset Ov shown in FIG. 2 (A) or a negative offset Ov depicted in FIG. 2 (B) appears unchecked in the output of the peak value detecting circuit. For this reason, the conventional peak value detecting circuit suffers irregularities in its input/output characteristic. The disadvantage is particularly pronounced when the level of the signal handled is low.

OBJECTS AND SUMMARY OF THE INVENTION

It is therefore an object of the present invention to provide a peak value detecting circuit which prevents a DC offset of a signal output circuit in the output stage from appearing in an external output signal.

In carrying out the invention and according to one aspect thereof, there is provided a peak value detecting circuit comprising a voltage comparing section and a signal output circuit, wherein the signal output circuit located in the output stage of the peak value detecting circuit feeds back its output signal to the voltage comparing section for comparison with an input signal voltage entered into the latter. Where the peak value of the actual output voltage is compared with the input signal voltage and a discrepancy attributable to a DC offset of the signal output circuit is detected between the two voltages, means are provided to prevent the error from appearing in the output signal. This setup improves the input/output characteristic of the peak value detecting circuit.

BRIEF DESCRIPTION OF THE DRAWINGS

FIG. 1 is a block diagram of a typical prior art peak value detecting circuit;

FIGS. 2 (A) and 2 (B) are graphs depicting the relationship between input signal voltage peak value and output signal voltage in connection with the prior art circuit of FIG. 1;

FIG. 6 is a schematic diagram of a typical setup in which the first embodiment of the invention is used; and FIG. 7 is a circuit diagram of another peak value detecting circuit according to a second embodiment of the invention.

DESCRIPTION OF THE PREFERRED EMBODIMENTS

Figure 3:
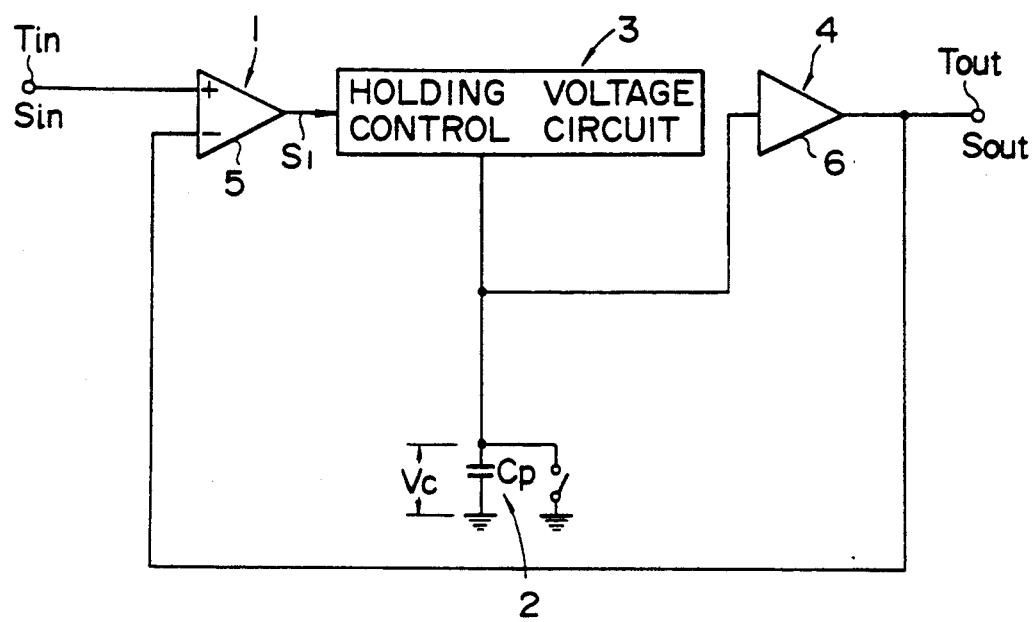
FIG. 3 is a block diagram of a peak value detecting circuit according to a first embodiment of the present invention.

FIG. 3 is a block diagram of the peak value detecting circuit practiced as the first embodiment of the invention. In the novel circuit of FIG. 3 as well as in the prior art example of FIG. 1, like reference characters designate like or corresponding parts.

Referring to FIG. 3, the first embodiment has a voltage comparing section 1 made of a comparator 5. An output signal voltage $S_{out}$ of a signal output circuit 4 is input as a reference signal voltage to a reference voltage input terminal (−) of the comparator 5, whereas an input signal voltage $S_{in}$ supplied to an input terminal $T_{in}$ is forwarded to a compare voltage input terminal (+) of the comparator 5. The two voltages $S_{in}$ and $S_{out}$ are compared by the voltage comparing section 1. That is, what takes place in the voltage comparing section 1 is a comparison of the input signal voltage $S_{in}$ entering the peak value detecting circuit, with the actual output signal voltage $S_{out}$ at an output terminal $T_{out}$ of the circuit. If an offset occurs in a buffer amplifier 6 constituting the signal output circuit 4, the constitution of the embodiment prevents that offset from appearing in the output signal voltage $S_{out}$.

Why the offset of the buffer amplifier 6 does not appear in the output signal voltage $S_{out}$ will now be described in more detail. In case the buffer amplifier 6 develops an offset, the output signal voltage $S_{out}$ leaving the signal output circuit 4 contains the offset component. Assume that a positive offset Ov as shown in FIG. 2 (A) has developed in the buffer amplifier 6. In that case, the output signal voltage $S_{out}$ leaving the signal output circuit 4 is the sum of the offset Ov and a holding voltage Vc of a peak holding capacitor Cp in a peak voltage holding circuit 2. That is, $$S_{out} = Vc + Ov \quad (1)$$

Because the first embodiment has its voltage comparing section 1 compare the output signal voltage $S_{out}$ containing the offset Ov with the input signal voltage $S_{in}$, the voltage $V_c$ held by the peak holding capacitor Cp is a voltage lower by the offset Ov than the peak value Vp of the previously input signal voltage. That is, $$Vc = Vp - Ov \qquad (2)$$

From equations (1) and (2) above, we get $$S_{out} = (Vp - Ov) + Ov = Vp \qquad (3)$$

Figure 4:
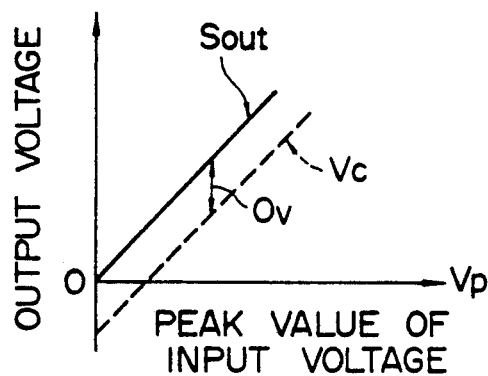
FIG. 4 is a graph illustrating the relationship between input voltage peak value and output voltage in connection with the first embodiment of FIG. 3 in which a signal output circuit has developed a positive offset.

As the input voltage peak value versus output voltage characteristic of FIG. 4 indicates, the output signal voltage $S_{out}$ does not contain the offset Ov. The precise peak value Vp of the input signal voltage $S_{in}$ is now output.

Conversely, if the buffer amplifier 6 develops a negative offset Ov, the output signal voltage $S_{out}$ drops by the amount of that offset. Because the reference voltage entering the voltage comparing section 1 is lowered by the offset Ov, the voltage Vc held by the peak holding capacitor Cp is raised precisely by the offset Ov. That is, $$S_{out} = Vc - Ov \qquad (4)$$

$$Vc = Vp + Ov \qquad (5)$$

From equations (4) and (5) above, we get $$S_{out} = (Vp + Ov) - Ov = Vp \qquad (6)$$

Figure 5:
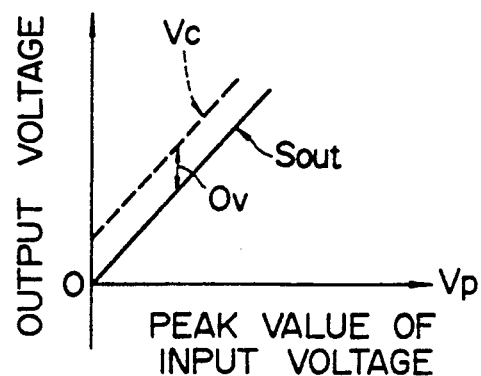
FIG. 5 is a graph depicting the relationship between input voltage peak value and output voltage in connection with the first embodiment of FIG. 3 in which the signal output circuit has developed a negative offset.

In this case, too, the output signal voltage $S_{out}$ does not contain the offset Ov, as indicated by the input voltage peak value versus output voltage characteristic of FIG. 5. The peak value Vp of the previously input signal voltage $S_{in}$ is now output precisely.

The first embodiment of the above-described constitution may illustratively be used in the so-called matrix surround circuit of a multiplex broadcast receiving circuit, an example of the matrix surround circuit is depicted in FIG. 6. In the circuit of FIG. 6, an in-phase component (L+R) and a opposite-phase component (L−R) of the right channel signal R and the left channel signal L are supplied to two input terminals. The level of the opposite-phase component (L−R) is controlled by a voltage controlled amplifier (VCA) 10 for output, with the gain of the VCA varied according to the input signal. More specifically, the output of the VCA 10 is supplied to a first peak value detecting circuit 12. The in-phase component (L+R) given to one input terminal is fed via a filter 18 to a second peak value detecting circuit 13. In this case, suitable means are used to subtract the output of either the first peak value detecting circuit or that of the second circuit opposite from that of the other circuit. The outputs from the two detecting circuits are then supplied to an adder 14. The result of the addition by the adder 14 is sent to a VCA control circuit 11.

The VCA control circuit 11 comprises a resistor 15, an amplifier 16 and a capacitor 17. Where the input signal is constant in level and the servo involved is converged, the VCA control circuit 11 supplies the VCA 10 with a control signal Sc that brings to 0 an input signal current i that flows in through the resistor 15. This means that the gain of the VCA 10 is determined by the ratio of two currents, one current flowing into the VCA control circuit 11 via the second peak detecting circuit 13, the other current flowing into the VCA control circuit 11 via the first peak value detecting circuit 12. In this setup, the output signal (L−R) obtained by controlling the opposite-phase component level is sent to the output terminal, as described above. If there occurs a discrepancy between the first and the second peak value detecting circuits 12 and 13, then an error appears in the output signal (L−R). That is, if an offset develops in the buffer amplifier 6 interposed between the first and the second peak value detecting circuits 12 and 13, that offset translates into the error that appears in the output signal (L−R). In this kind of system, the error is most undesirable because it manifests itself as deterioration of the frequency characteristic. However, where the first embodiment is used in the circuit of FIG. 6, there occurs no offset Ov in its output signal as depicted. This means that the circuit operation remains normal and that a better frequency characteristic than that of conventional circuits is provided by the invention.

In the first embodiment described above, the peak voltage holding circuit 2 has been constituted using the peak holding capacitor Cp with one end thereof connected to ground. Alternatively, the peak voltage holding circuit 2 may comprise an operation amplifier 20 and a capacitor 21, as shown in FIG. 7. This is the second embodiment of the invention.

As described above according to the invention, there is provided a peak value detecting circuit comprising a signal output circuit, a voltage comparing section and a peak voltage holding circuit, wherein the signal output circuit located in the output stage of the peak value detecting circuit feeds back its output $S_{out}$ to a compare input terminal of the voltage comparing section for comparison with an input signal voltage $S_{in}$ coming from the outside, and wherein the voltage held by the peak voltage holding circuit is varied in accordance with the result of the comparison. If the signal output circuit develops an offset, a voltage lowered by the amount of that offset is held as the peak voltage by the peak voltage holding circuit. That is, when the voltage thus held is sent to the outside, the voltage is supplemented by the offset of the signal output circuit. Because the offset is eliminated by application of the voltage differential between the actual peak voltage and the holding voltage, the offset does not appear in the output signal voltage $S_{out}$ of the peak value detecting circuit. This improves the input/output characteristic of the peak value detecting circuit. Since the novel circuit according to the invention is produced by simply modifying the wiring of the conventional counterpart in a limited manner, little increase is expected in the scale or sophistication of the circuit while the above and other benefits of the invention are fully made available.

While preferred embodiments of the invention have been described using specific terms, such description is for illustrative purposes only, and it is to be understood that changes and variations may be made without departing from the spirit or scope of the appended claims.

What is claimed is:

1. A signal level control circuit comprising:
   a voltage-controlled amplifier to which a first input signal (L−R) is supplied and for producing an output signal having a level controlled by a control signal;
   a filter to which a second input signal (L+R) is supplied and which outputs a signal having a predetermined frequency range;

a first peak value detecting circuit for detecting a peak value of the output signal from said filter and producing a first peak value output signal;

a second peak value detecting circuit for detecting a peak value of the output signal from said voltage control amplifier and producing a second peak value output signal;

an arithmetic circuit for performing an arithmetic operation on the first and second peak value output signals from said first and said second peak value detecting circuits and producing a resultant output signal; and a voltage-controlled amplifier control circuit having an opposite-phase input terminal, an in-phase input terminal and an output terminal, said opposite-phase input terminal receiving the output signal from said arithmetic circuit, said in-phase input terminal receiving a reference voltage, said output terminal and said opposite-phase input terminal having a capacitor connected therebetween, and said output terminal being feed-back connected as said control signal to said voltage-controlled amplifier for controlling the level of the output signal therefrom.

2. A signal level control circuit according to claim 1, wherein said arithmetic circuit is an adder-subtracter arrangement having a minus input connected to said first peak value output signal and a plus input connected to said second peak value output signal.

3. A signal level control circuit according to claim 1, wherein said first peak value detecting circuit comprises:

a peak voltage holding circuit for holding a peak value of the output signal from said filter;

a voltage comparing circuit for comparing a preceding peak value held by said peak voltage holding circuit with a present output signal from said filter and producing an output signal;

a holding voltage control circuit for controlling the level of said peak voltage in accordance with the output signal from said voltage comparing circuit as a result of the comparing operation therein; and a signal output circuit connected to said peak voltage holding circuit for buffering said peak voltage held by said peak voltage holding circuit and producing said first peak value output signal, wherein the output voltage from said signal output circuit is fed back as a reference voltage to a compare input terminal of said voltage comparing circuit.

4. A signal level control circuit according to claim 1, wherein said second peak value detection circuit comprises:

a peak voltage holding circuit for holding a peak value of the output signal from said voltage-controlled amplifier;

a voltage comparing circuit for comparing a preceding peak value held by said peak voltage holding circuit with a present output signal from said voltage-controlled amplifier and producing an output signal;

a holding voltage control circuit for controlling the level of said peak voltage in accordance with the output signal from said voltage comparing circuit as a result of the comparing operation therein; and a signal output circuit connected to said peak voltage holding circuit for buffering said peak voltage held by said peak voltage holding circuit and producing said second peak value, wherein the output voltage from said signal output circuit is fed back as a reference voltage to a compare input terminal of said voltage comparing circuit.

5. A signal level control circuit according to claim 1, wherein said first peak value detecting circuit comprises an operation amplifier having an opposite-phase input terminal connected to the output signal from said filter, an output terminal, and an in-phase input terminal connected to a predetermined reference signal, said opposite-phase input terminal and said output terminal having a capacitor connected therebetween, and said first peak value output signal being present at said output terminal.

6. A signal level control circuit according to claim 1, wherein said second peak value detecting circuit comprises an operation amplifier having an opposite-phase input terminal connected to the output of said voltage-controlled amplifier, an output terminal, and an in-phase input terminal connected to a predetermined reference voltage, said opposite-phase input terminal and said output terminal having a capacitor connected therebetween, and said second peak value output signal being present at said output terminal.

* * * * *